(12) United States Patent
Schreiber et al.

(10) Patent No.: US 9,373,418 B2
(45) Date of Patent: Jun. 21, 2016

(54) CIRCUIT AND DATA PROCESSOR WITH HEADROOM MONITORING AND METHOD THEREFOR

(71) Applicant: Advanced Micro Devices, Inc., Sunnyvale, CA (US)

(72) Inventors: Russell Schreiber, Austin, TX (US); Stephen Kosonocky, Fort Collins, CO (US); Amlan Ghosh, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 94 days.

(21) Appl. No.: 14/146,118

(22) Filed: Jan. 2, 2014

(65) Prior Publication Data

US 2015/0187437 A1    Jul. 2, 2015

(51) Int. Cl.
| G11C 29/00 | (2006.01) |
| G11C 29/24 | (2006.01) |
| G11C 29/02 | (2006.01) |
| G11C 11/41 | (2006.01) |
| G11C 29/04 | (2006.01) |
| G11C 29/12 | (2006.01) |

(52) U.S. Cl.
CPC .............. *G11C 29/24* (2013.01); *G11C 29/028* (2013.01); *G11C 11/41* (2013.01); *G11C 2029/0409* (2013.01); *G11C 2029/1204* (2013.01)

(58) Field of Classification Search
None
See application file for complete search history.

(56) References Cited

U.S. PATENT DOCUMENTS

| 5,067,078 | A | 11/1991 | Talgam et al. | |
| 6,487,108 | B2* | 11/2002 | Pochmuller | 365/158 |
| 7,586,333 | B1* | 9/2009 | Raghavan et al. | 326/88 |
| 7,821,859 | B1* | 10/2010 | Raghavan | 365/208 |
| 2002/0186579 | A1* | 12/2002 | Yokozeki | 365/154 |
| 2006/0117155 | A1* | 6/2006 | Ware et al. | 711/163 |
| 2008/0130375 | A1* | 6/2008 | Raghavan et al. | 365/189.02 |
| 2009/0168499 | A1* | 7/2009 | Kushida et al. | 365/156 |
| 2010/0250865 | A1* | 9/2010 | Rao et al. | 711/149 |
| 2012/0147682 | A1* | 6/2012 | Schreiber et al. | 365/191 |
| 2012/0198266 | A1* | 8/2012 | Hofmann | G06F 1/06 713/501 |
| 2012/0281568 | A1* | 11/2012 | Ho et al. | 370/252 |
| 2013/0322154 | A1* | 12/2013 | Youn et al. | 365/148 |
| 2014/0036879 | A1* | 2/2014 | Pirskanen | 370/336 |
| 2014/0045543 | A1* | 2/2014 | Ishii et al. | 455/522 |

OTHER PUBLICATIONS

R. Jotwani, S. Sundaram, S. Kosonocky, A. Schaefer, V. F. Andrade, A. Novak and S. Naffziger, "An x86-64 Core in 32 nm SOI CMOS," IEEE Journal of Solid-State Circuits, vol. 46, No. 1, pp. 162-172, Jan. 2011.

* cited by examiner

*Primary Examiner* — Daniel McMahon
(74) *Attorney, Agent, or Firm* — Polansky & Associates, P.L.L.C.; Paul J. Polansky

(57) ABSTRACT

A circuit with headroom monitoring includes a memory array having memory cells, a replica array, and a built-in self test circuit. The replica array has a plurality of word lines, a plurality of bit line pairs, and memory cells located at intersections of the plurality of word lines and the plurality of bit line pairs. The memory cells are of a same type as memory cells in the memory array. The built-in self test circuit is coupled to the replica array for adding a capacitance to at least one bit line of the plurality of bit line pairs, for sensing a read time of memory cells of the replica array with the capacitance so added, and for providing a headroom signal in response to the read time.

19 Claims, 5 Drawing Sheets

CIRCUIT AND DATA PROCESSOR WITH HEADROOM MONITORING AND METHOD THEREFOR

FIELD

This disclosure relates generally to data processors, and more specifically to data processors with voltage and frequency headroom monitoring.

BACKGROUND

In data processors, performance is determined by operation frequency. In order to conserve power, some modern complementary metal oxide semiconductor (CMOS) data processors have adopted adaptive voltage and frequency scaling (AVFS). AVFS allows an operating system (OS) to adaptively scale a data processor's clock frequency and to set the power supply voltage to a level that is based on the clock frequency. The speed is set high enough for current processing tasks, but not too high so that power consumption can be kept low. For example, if on average the data processor is heavily utilized, then the OS determines that the clock frequency should be increased. On the other hand if on average the data processor is lightly utilized, then the OS determines that the clock frequency should be decreased.

Processors that support AVFS conveniently allow their frequencies and voltages to be increased as directed by the OS up to their performance limits. The difference between the performance limit and the current frequency and/or voltage is known as headroom. Accurately determining the available headroom of the data processor can be difficult as process, voltage, and temperature (PVT) vary.

Figure 1:
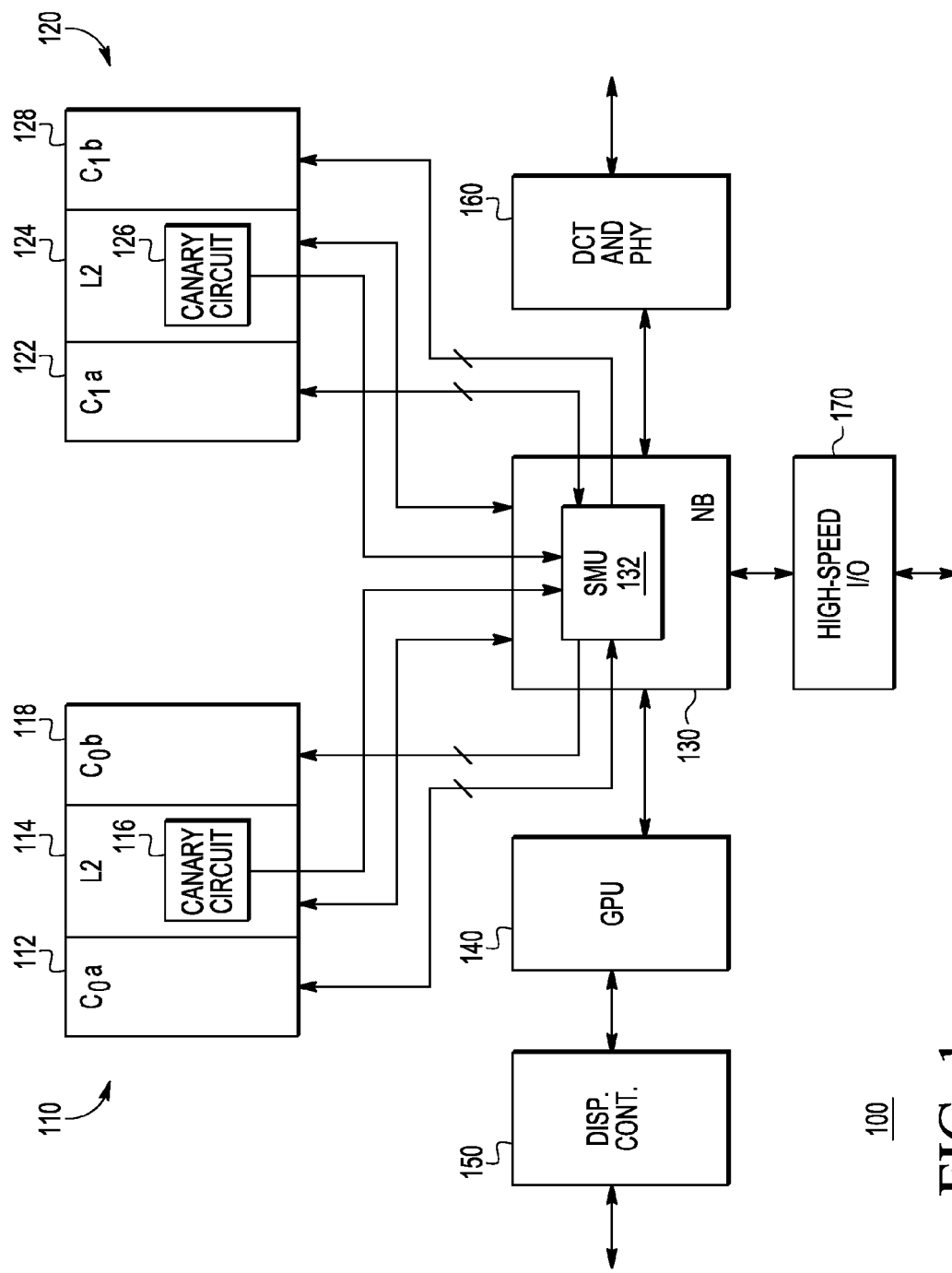
FIG. 1 illustrates in block diagram form a data processor with AVFS according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A circuit with headroom monitoring as disclosed below includes a memory array having memory cells, a replica array, and a built-in self-test (BIST) circuit. The replica array has a multiple number of word lines, a multiple number of bit line pairs, and memory cells located at intersections of the multiple number of word lines and the multiple number of bit line pairs. The memory cells in the replica array are of the same type as the memory cells in the memory array. The BIST circuit adds a capacitance to at least one bit line of the multiple number of bit line pairs, senses a read time of memory cells with the capacitance so added, and provides a headroom signal in response to the read time. In this way, the replica array simulates the read current from a degraded memory cell that limits the access speed and determines the headroom of the memory array.

In some embodiments, a data processor includes a processing core, a cache such as an L2 cache, and a canary circuit. The cache is connected to the processor core and has a tag array, a data array, and a cache controller. The canary circuit simulates a degraded memory cell in the cache by adding capacitance to a bit line in a replica array and sensing a read speed.

FIG. 1 illustrates in block diagram form a data processor 100 with AVFS according to some embodiments. For the example shown in FIG. 1, data processor 100 generally includes a processor core module 110, a processor core module 120, a Northbridge (NB) 130, a processor core that is a graphics processing unit (GPU) core 140, a display controller 150 labeled "DISP. CONT.", a DRAM controller and physical layer interface (DCT and PHY) 160, and a high speed input/output (I/O) controller 170.

Processor core module 110 includes a central processing unit (CPU) core 112 labeled "$C_{0a}$", an L2 cache 114, and a CPU core 118 labeled "$C_{0b}$". Processor core module 120 includes a CPU core 122 labeled "$C_{1a}$", an L2 cache 124, and a CPU core 128 labeled "$C_{1b}$". Each one of L2 caches 114 and 124 includes a corresponding canary circuit 116 and 126 labeled "CANARY CKT".

NB 130 includes a system management unit (SMU) 132. NB 130 is connected to each one of L2 caches 114 and 124. SMU 132 is connected to each one of the CPU cores 112, 118, 122, and 128, and has two inputs connected to each of the two outputs of canary circuits 116 and 126.

GPU core 140 is connected to NB 130. Display controller 150 is connected to GPU core 140, and has an output for connecting to a display (not shown) for providing visual data to a user. DCT and PHY 160 is connected to NB 130, where the DCT portion is connected to the PHY portion, and the PHY portion is adapted to connect to an external memory that generally includes commercially available DRAM chips such as double data rate (DDR) synchronous DRAM (SDRAM) chips (not shown). High speed I/O controller 170 is connected to NB 130, and is connected to a set of high-speed peripherals (not shown).

In operation, each one of the processor cores performs a set of tasks during active periods. At least a portion of their internal circuits remain idle between the active periods. During active periods, the CPU cores fetch and execute instructions and access data (during a read or a write operation) associated with the instructions, and GPU core 140 performs graphics and video processing computations as needed.

When performing instruction fetches or data accesses, a CPU core first accesses its first level (L1) cache (not shown), and if the access misses, the L1 cache accesses the corresponding one of L2 caches 114 and 124, since the L2 cache is the next lower level of the memory hierarchy. If the access misses in the L2 cache, the L2 cache provides a memory access request to NB 130. NB 130 stores access requests for dispatch to DCT and PHY 160. DCT and PHY 160 schedules memory requests and provides an interface between NB 130 and the external memory. To access data, the PHY portion provides standard control, bank address, and row and column address signals to the external memory.

Data processor 100 implements AVFS using canary circuits strategically placed throughout each processor core module to determine available voltage and/or frequency headroom. A canary circuit is a relatively small circuit that simulates the operation of a larger circuit. L2 caches 114 and 124 include canary circuits 116 and 126 to determine their respective headrooms. Canary circuits 116 and 126 use a small "replica" array of memory cells to simulate the operation of a degraded memory cell (i.e. a slow memory cell that limits speed) in the much larger cache data and tag arrays. Canary circuits 116 and 126 simulate read and write speeds of the corresponding L2 caches and SMU 132 determines frequency headroom based on these measurements. In particular, canary circuits 116 and 126 perform read cycles by adding capacitance to each bit line of the replica array to simulate the operation of degraded memory cells in the cache, as will be discussed further below. By simulating degraded memory cells in the canary circuits using bit line capacitance, data processor 100 is able to accurately determine voltage and/or frequency headroom of the caches without the need for larger replica arrays.

In some embodiments, canary circuits 116 and 126 determine headroom further by adding a variable delay in activating the word line during a write cycle. Canary circuits 116 and 126 use this technique to simulate a write cycle to a degraded memory cell.

SMU 132 periodically polls the measured access times to determine available headroom, and uses the headroom to adjust operating frequency and power supply voltage.

Figure 2:
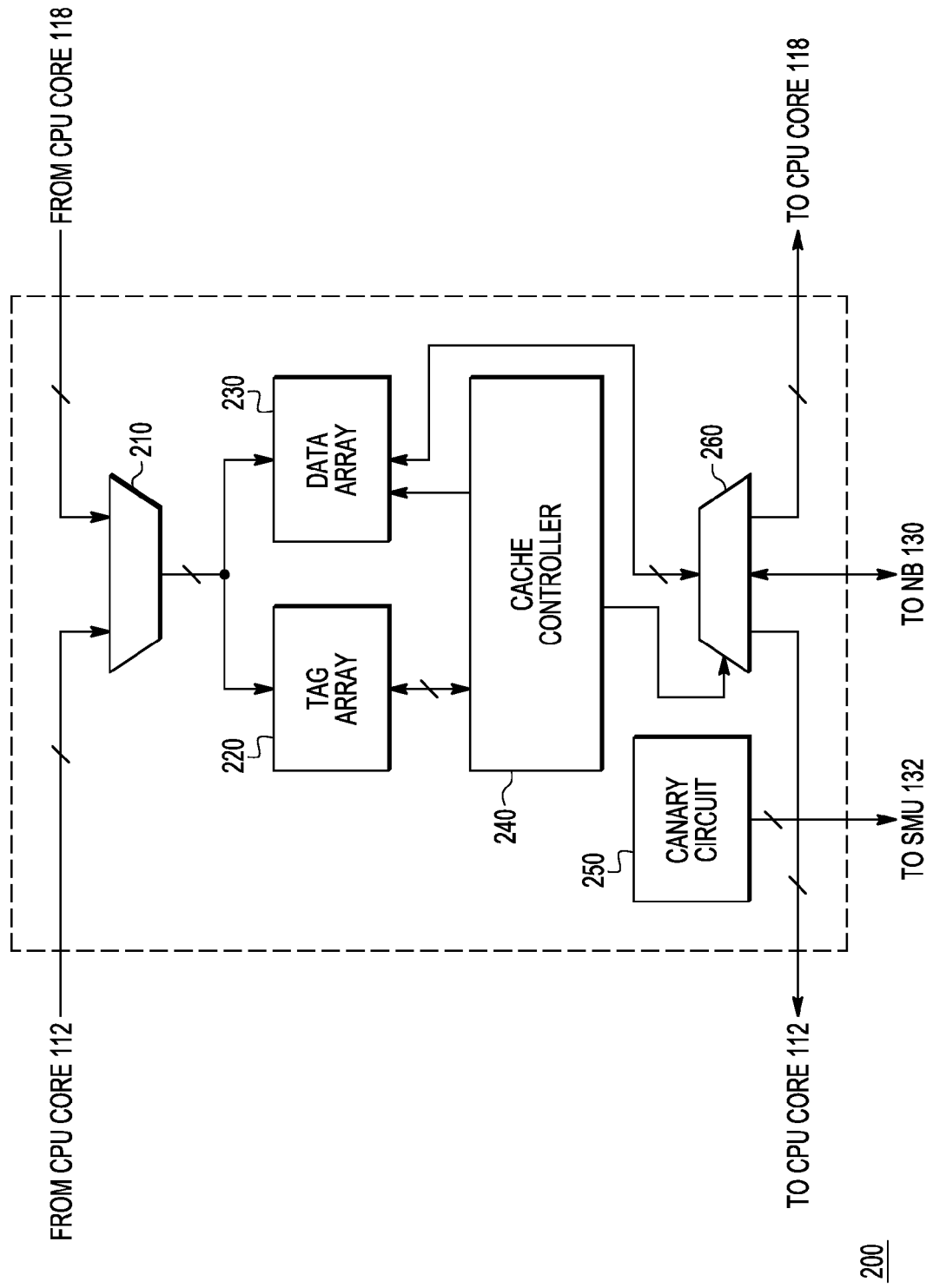
FIG. 2 illustrates in block diagram form a second level (L2) cache that may be used to implement each one of the L2 caches of FIG. 1 according to some embodiments.

FIG. 2 illustrates in block diagram form an L2 cache 200 that may be used to implement each one of L2 caches 114 and 124 of FIG. 1 according to some embodiments. L2 cache 200 includes a multiplexer 210, a tag array 220, a data array 230, a cache controller 240, a canary circuit 250, and a multiplexer 260.

Multiplexer 210 has a first input for receiving memory access requests from CPU core 112, a second input for receiving memory access requests from CPU core 118, and an output. Tag array 220 has an input connected to the output of multiplexer 210 for receiving the memory access requests, and a bidirectional control port. Data array 230 has an input connected to the output of multiplexer 210, a control input, and a bidirectional data port. Cache controller 240 has a bidirectional control port connected to the bidirectional control port of tag array 220, a first output connected to the control input of data array 230, and a second output. Canary circuit 250 has an output for providing access time information to SMU 132. Multiplexer 260 has a demultiplexed port connected to the bidirectional data port of data array 230, a first multiplexed port for exchanging data with CPU core 112, a second multiplexed port for exchanging data with NB 130, a third multiplexed port for exchanging data with CPU core 118, and a control input connected to the second output of cache controller 240.

In operation, cache controller 240 receives read and write requests from CPU cores 112 and 118, and accesses data in data array 230 if the requests from CPU cores 112 and 118 "hit" in the cache. Tag array 220 stores indexes and status bits for cache line in data array 230. Cache controller 240 controls tag array 220, data array 230, and multiplexer 260 to selectively store data in data array 230, retrieve and update data from data array 230 in response to accesses from CPU cores 112 and 118, fetch data for accesses that "miss" in L2 cache 200 from lower levels of the memory system through NB 130, and writeback data to lower levels of the memory system through NB 130 according to a cache replacement policy. The operation of caches such as L2 cache 200 is well known.

The access time of L2 cache 200 may limit the headroom of CPU cores 112 and 118. However if L2 cache 200 has a relatively large capacity, such as 2 megabytes (2 MB) or more, tag array 220 and data array 230 are also relatively large circuits, making their access times hard to measure with small replica circuits. Moreover because of the large size, the access speed of the data bits in tag array 220 or data array 230 may vary significantly from one end of the array to the other, as well as over process, voltage, and temperature (PVT) variations. Accurately determining the available headroom without large replica circuits over PVT presents significant challenges.

However L2 cache 200 includes a relatively small canary circuit 250 that accurately simulates the access time of tag array 220 and data array 230. As will be explained further below, it does so by performing write and read cycles to a much smaller replica array and adding capacitance to the bit lines to simulate the operation of degraded memory cells that may exist in tag array 220 or data array 230 and limit their access speeds. Canary circuit 250 outputs the measured access times when polled by SMU 132, and SMU 132 further processes them to form an overall estimate of access time that it evaluates along with other canary circuits to form overall headroom estimates, which it then uses to make power management decisions, such as selective power boosting.

Figure 3:
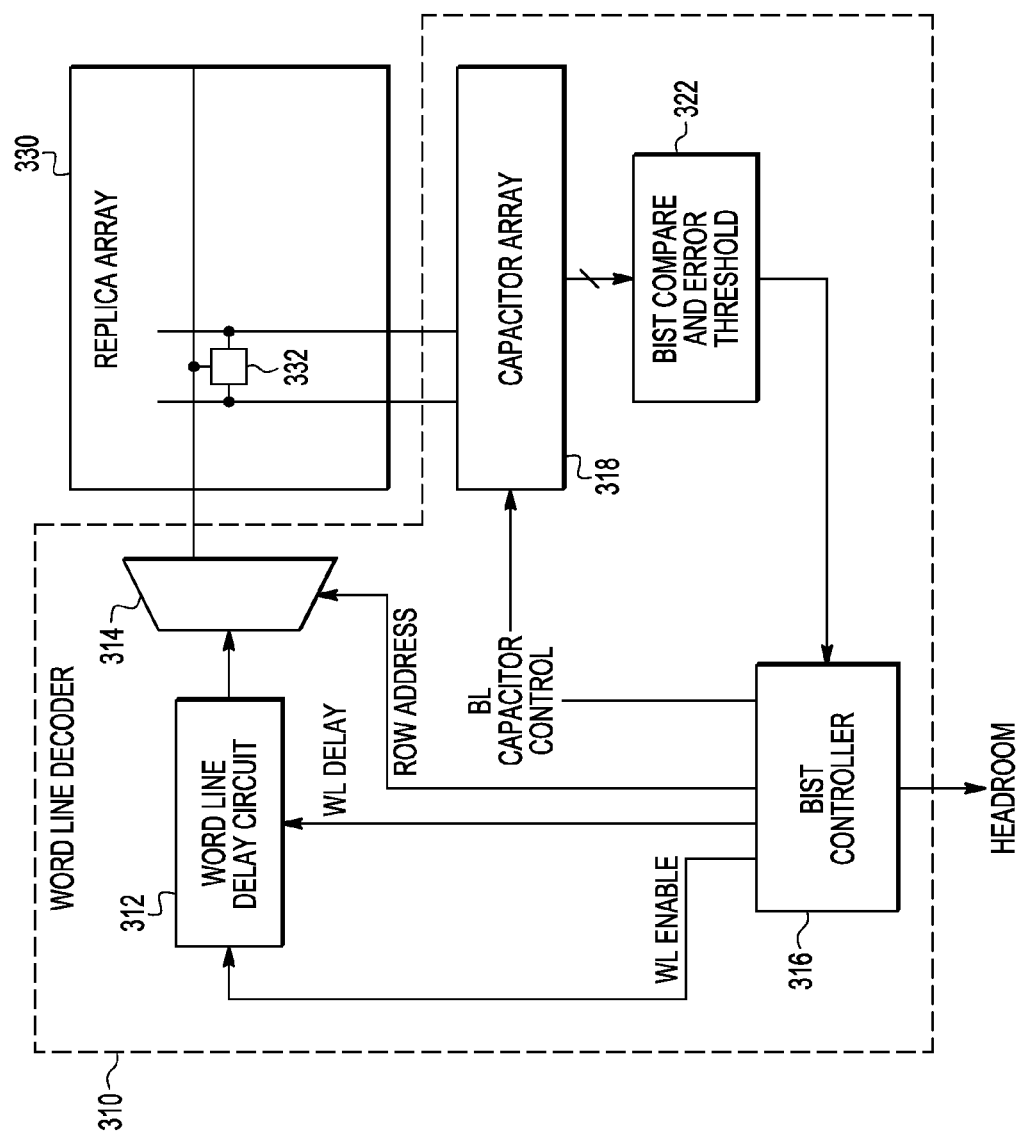
FIG. 3 illustrates in block diagram form a canary circuit that may be used to implement the canary circuit of FIG. 2 according to some embodiments.

FIG. 3 illustrates in block diagram form a canary circuit 300 that may be used to implement canary circuit 250 of FIG. 2 according to some embodiments. For the example shown in FIG. 3, canary circuit 300 generally includes a BIST circuit 310 and a replica array 330.

BIST circuit 310 includes a word line delay circuit 312, a word line decoder 314, a BIST controller 316, a capacitor array 318, and a BIST compare and error threshold circuit 322. Word line delay circuit 312 has a first input for receiving a signal labeled "word line ("WL") ENABLE", a second input for receiving a signal labeled "WL DELAY", and an output. Word line decoder 314 has a first input for receiving a row address, a second input connected to the output of word line delay circuit 312, and a set of word line outputs. BIST controller 316 has an input, a first output connected to the first input of word line delay circuit 312 for providing the WL ENABLE signal, a second output connected to the second input of word line delay circuit 312 for providing the WL DELAY signal, a third output connected to the first input of word line decoder 314 for providing the ROW ADDRESS, a fourth output for providing a signal labeled "BL CAPACITOR CONTROL", and a fifth output for providing a signal labeled "HEADROOM". Capacitor array 318 has a first input connected to the third output of BIST controller 316 for receiving the BL CAPACITOR CONTROL signal. BIST compare and error threshold circuit 322 has an input connected to capacitor array 318, and an output connected to the input of BIST controller 316. Capacitor array 318 is connected to each bit line pair of replica array 330.

Replica array 330 includes an array of memory cells located at intersections of word lines and bit line pairs such as exemplary memory cell 332 shown in FIG. 3. The memory cells in replica array 330 are the same type as memory cells in tag array 220 and data array 230. For example if tag array 220 and data array 230 are implemented using six-transistor (6T) static random access memory (SRAM) cells, then replica array 330 also includes 6T SRAM memory cells. The memory cells in replica array 330 also have the same layout as the memory cells in tag array 220 and data array 230 so that their access times correlate well.

In operation, canary circuit 300 determines the access time of L2 cache 200 and provides the HEADROOM signal in response. The HEADROOM signal is a signal that indicates, directly or in conjunction with other information, the headroom of a CPU core or CPU core modules such as processor modules 110 and 120. In the embodiment illustrated in FIG. 3, BIST controller 316 provides the HEADROOM signal as a measure of access time, which indicates an operating frequency limit. SMU 132 periodically polls the HEADROOM signal to determine the frequency limit, and subtracts the current operating frequency from the frequency limit to obtain the headroom. In other embodiments, BIST controller 316 may perform the conversion from access time to frequency limit and use the HEADROOM signal to indicate the frequency limit. In still other embodiments, BIST controller 316 may keep an indication of current operating frequency and provide the HEADROOM signal as a measure of actual frequency headroom.

SMU 132 uses the headroom indicated by the HEADROOM signal to make voltage and frequency decisions. For example, SMU 132 may increase the frequency of a heavily-utilized processor core module within its available headroom and within an overall chip power budget, while setting the voltage as a low voltage that is safe for operation at the selected frequency.

BIST controller 316 is a state machine that performs read and write cycles to replica array 330 to estimate the access time of tag array 220 and data array 230. In particular canary circuit 300 adds capacitance to bit line pairs in replica array 330 to simulate the operation of a degraded memory cell in tag array 220 or data array 230. In this way, canary circuit 330 is able to use a relatively small replica array to determine access time of a much larger memory circuit.

BIST controller 316 activates the WL ENABLE signal to initiate an access in replica array 330. BIST controller 316 optionally adds a delay by selectively providing the WL DELAY signal to word line delay circuit 312. The output of word line delay circuit 312 causes word line decoder 314 to decode the row address provided by BIST controller 316 to activate a word line in replica array 330. In some embodiments, BIST controller 316 does not delay word line activation during read cycles, but uses word line delay circuit 314 to delay the activation of the word lines using word line delay circuit 312 during write cycles. During write cycles, word line delay circuit 312 provides an amount of delay to word line decoder 314 such that a write speed with the delay approximates the write speed of a degraded memory cell in tag array 220 or data array 330. In some embodiments, a degraded memory cell has a slower than average write time representing about 5.5 σ (sigma) above a nominal write time of the distribution of write times.

During a read operation of replica array 330, BIST controller 316 also provides the BL CAPACITOR CONTROL signal to capacitor array 318 to add capacitance to the bit lines of replica array 330 such that a read speed of a memory cell of replica array 330 is approximately equal to a read speed of a degraded memory cell of tag array 220 or data array 230. In some embodiments, a degraded memory cell has a lower than average read current representing about 5.5 σ below a nominal read current ($I_{READ}$) of the distribution of read currents.

The read current of a bit cell is substantially constant over the small drain-to-source voltage ($V_{DS}$) swing that occurs while it develops a differential voltage sufficient to be accurately sensed. Capacitance can also be considered to be substantially constant during the same $V_{DS}$ swing. Using these relationships, it is possible to approximate the time to develop a suitable differential voltage of a weak cell (5.5 σ below $I_{READ}$ of a nominal bit cell) in tag array 220 or data array 230 by adding an appropriate amount of capacitance $C_{ADDER}$ to the capacitance C of a nominal bit cell. If the time to develop the differential voltage on the nominal bit cell is $C\Delta V/I_{READ}$, and if this bit cell is used to simulate a bit cell with a weak read current $I_{READWEAK}$, then the amount of capacitance needed to approximate amount of time to develop the same differential is $$\frac{C\Delta V}{IREADWEAK} = \frac{(C + CADDER)\Delta V}{IREAD} \quad [1]$$

which simplifies to:

$$CADDER = C * \left(\frac{IREAD}{IREADWEAK} - 1\right) \quad [2]$$

BIST compare and error threshold circuit 322 senses a read time of selected memory cells of replica array 330 with the added capacitance connected to the bit lines, and provides an indication of the read time and any read errors, slow read times, or marginal read times to BIST controller 316.

During write operations, BIST controller 316 delays the input of the WL ENABLE signal to address decoder 314 to simulate the operation of a degraded memory cell. BIST compare and error threshold circuit 322 senses write times of memory cells of replica array 330.

BIST controller 316 performs a complete BIST algorithm as follows. First it writes data to all bit cells in replica array 330 using safe write timing. Then it performs read cycles to all rows in replica array 330 using capacitor array 318 to estimate the read access time to a slow memory cell in tag array 220 or data array 230 as described above. The it performs a write cycle to a portion of replica array 330 followed by a safe read cycle, using word line delay circuit 312 to simulate the operation of a degraded memory cell in tag array 220 or data array 230. After suitable averaging of the read and write cycle times, BIST controller 316 provides the HEADROOM signal as the overall estimate of the access time to degraded memory cells in tag array 220 or data array 230.

Figure 4:
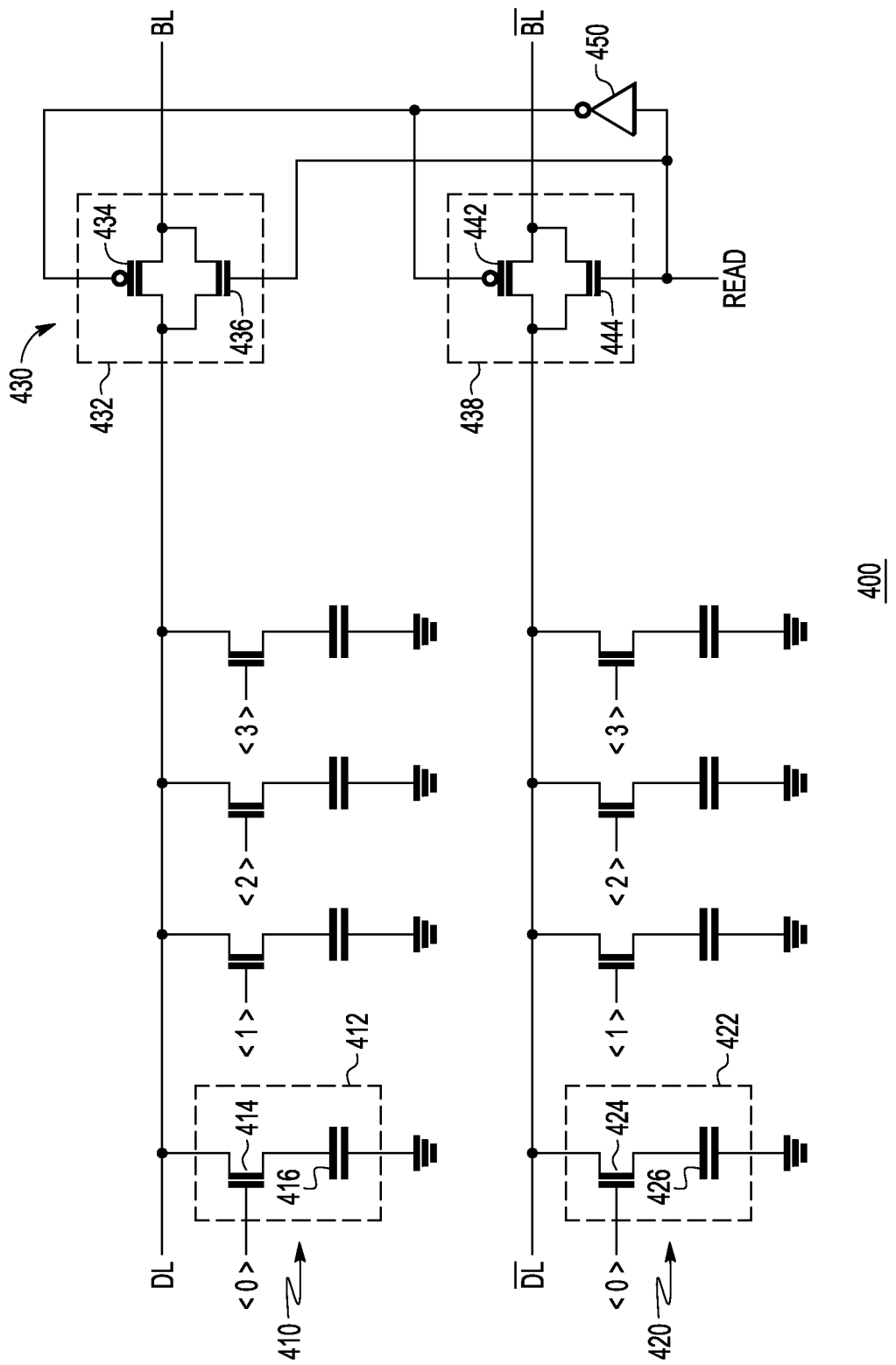
FIG. 4 illustrates in schematic form a portion of a capacitor array that may be used to implement the capacitor array of FIG. 3 according to some embodiments.

FIG. 4 illustrates in schematic form a portion 400 of a capacitor array that may be used to implement capacitor array 318 of FIG. 3 according to some embodiments. Portion 400 includes sets of switched capacitors 410 and 420, a pair of CMOS switches 430, and an inverter 450.

A switched capacitor 412 is representative of other switched capacitors in set 410 and includes an N-channel metal oxide semiconductor field effect transistor (MOSFET) 414 and a capacitor 416. MOSFET 414 has a drain connected to a true data line labeled "DL", a gate for receiving a corresponding one of a set of tuning control signals labeled "<0>", "<1>", "<2>", and "<3>", and a source. Capacitor 416 has a first terminal connected to the source of a MOSFET 414, and a second terminal connected to a ground power supply terminal. Likewise a switched capacitor 422 is representative of other switched capacitors in set 420 and includes an N-channel MOSFET 424 and a capacitor 426. MOSFET 424 has a drain connected to a complement data line labeled "$\overline{DL}$", a gate for receiving a corresponding one of tuning control signals <0>, <1>, <2>, and <3>, and a source. Capacitor 426 has a first terminal connected to the source of a MOSFET 424, and a second terminal connected to ground.

CMOS switches 430 include a CMOS switch 432 and a CMOS switch 438. CMOS switch 432 includes a P-channel MOSFET 434 and an N-channel MOSFET 436. MOSFET 434 has a gate, a drain connected to a bit line labeled "BL", and a source connected to data line DL. MOSFET 436 has a gate for receiving a signal labeled "READ", a drain connected to the BL bit line, and a source connected to the DL data line. CMOS switch 438 includes a P-channel MOSFET 442 and an N-channel MOSFET 444. MOSFET 442 has a gate, a drain connected to a bit line labeled "$\overline{BL}$", and a source connected to data line $\overline{DL}$. MOSFET 444 has a gate for receiving the READ signal, a drain connected to the $\overline{BL}$ bit line, and a source connected to the $\overline{DL}$ data line. Inverter 450 has an input for receiving the READ signal and an output connected to the gates of MOSFETs 434 and 442.

In operation, BIST controller 316 activates selected ones of control signals <0>, <1>, <2>, and <3> to set the capacitance value on the DL and $\overline{DL}$ data lines to simulate a degraded memory cell in tag array 220 or data array 230 with a capacitance value $C_{ADDER}$ determined as described above. In the illustrated embodiment, canary circuit 200 adds about 1.7 times the capacitance of a nominal bit line and implements it using one large capacitor accounting for 0.4 times the bit line capacitance and three small capacitors each accounting for about 0.1 times the bit line capacitance. However in other embodiments, control signals <0>, <1>, <2>, and <3> and their corresponding capacitors could be equally weighted, binarily weighted, some combination of the two, etc.

BIST controller 316 activates the READ signal which causes CMOS switches 432 and 438 to become conductive. Data lines DL and $\overline{DL}$ are connected to BIST compare and error threshold circuit 322, which senses the read time as described above data line and its corresponding BL and $\overline{BL}$ bit lines of replica array 330.

Figure 5:
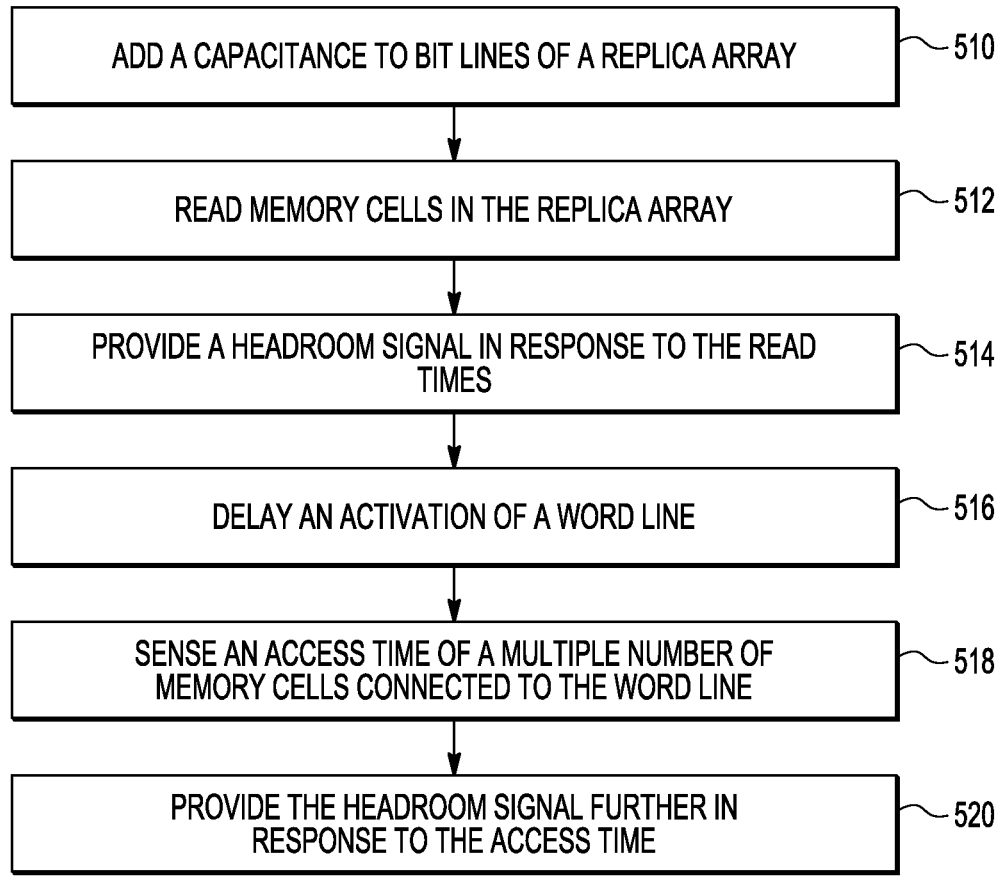
FIG. 5 illustrates a flow diagram of a method for determining headroom of the L2 cache of FIG. 2 according to some embodiments.

FIG. 5 illustrates a flow diagram of a method 500 for determining headroom of L2 cache 200 of FIG. 2 according to some embodiments. Action box 510 includes adding a capacitance to bit lines of a replica array. The replica array, such as replica array 330, has a multiple number of word lines and a multiple number of bit line pairs with memory cells located at intersections of the multiple number of word lines and the multiple number of bit line pairs. The memory cells in the replica array the same type as memory cells in a memory array. Action box 512 includes reading memory cells in the replica array. Action box 514 includes providing a headroom signal in response to the read times.

In some embodiments, the headroom signal is further determined in response to a write time of a degraded memory cell and method 500 includes further steps 516, 518, and 520. Action box 516 includes delaying an activation of a word line. Action box 518 includes sensing an access time of a multiple number of memory cells connected to the word line. Action box 520 includes providing the headroom signal further in response to the access time.

The functions of SMU 132 and canary circuit 300 (and especially BIST controller 316) may be implemented with various combinations of hardware and software. For example, they may be implemented by a basic input-output system (BIOS), an operating system, firmware, or software drivers, and use tables in a non-volatile memory. Some of the software components may be stored in a computer readable storage medium for execution by at least one processor. Moreover the method illustrated in FIG. 5 may also be governed in whole or in part by instructions that are stored in a computer readable storage medium and that are executed by at least one processor. Each of the operations shown in FIG. 5 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, the circuits of FIGS. 1-4 may be described or represented by a computer accessible data structure in the form of a database or other data structure which can be read by a program and used, directly or indirectly, to fabricate integrated circuits with the circuits of FIGS. 1-4. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising integrated circuits with the circuits of FIGS. 1-4. The netlist may then be placed and routed to produce a data set describing geometric shapes to be applied to masks. The masks may then be used in various semiconductor fabrication steps to produce integrated circuits of FIGS. 1-4. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, in the illustrated embodiments, data processor 100 includes pairs of CPU cores that are combined with an L2 cache in a processor core module. In various embodiments, data processor 100 could include different numbers of CPU and/or GPU cores or other types of cores such as such as digital signal processor (DSP) cores, video processing cores, multi-media cores, display engines, rendering engines, and the like. Also, CPU cores 112, 118, 122 and 128, GPU core 140, NB 130, and SMU 132 could be formed on a single integrated circuit as shown or could be formed on multiple integrated circuits.

In the illustrated embodiment of FIG. 1, L2 caches 114 and 124 include corresponding canary circuits 116 and 126. In some embodiments, other functional blocks such as GPU core 140 could also include a canary circuit (not shown) to develop headroom signals of large memory arrays as described above. Also, actual headroom can be determined using small canary circuits that provide headroom signals that are combined with other signals in a centralized SMU, or could be determined wholly within the canary circuit.

Accordingly, it is intended by the appended claims to cover all modifications of the disclosed embodiments that fall within the scope of the disclosed embodiments.

What is claimed is:

1. A circuit with headroom monitoring comprising:
   a memory array having memory cells;
   a replica array comprising a plurality of word lines, a plurality of bit line pairs, and memory cells located at intersections of said plurality of word lines and said plurality of bit line pairs, said memory cells in said replica array of a same type as said memory cells in said memory array; and
   a built-in self test circuit coupled to said replica array for adding a capacitance to at least one bit line of said plurality of bit line pairs, for measuring a read time of memory cells of the replica array with said capacitance, and for providing a headroom signal in response to said read time, wherein said read time indicates an operating frequency limit, and headroom is a difference between said operating frequency limit and a current operating frequency.

2. The circuit of claim 1 wherein said built-in self test circuit comprises:
   a capacitor array having a plurality of switched capacitors coupled to at least one bit line; and
   a built-in self test controller coupled to said capacitor array, for setting a capacitance of said switched capacitors such that a read speed with said capacitance is equal to a read speed of a degraded memory cell in said memory array.

3. The circuit of claim 2 wherein each of said plurality of switched capacitors comprises:
   a metal oxide semiconductor field effect transistor (MOSFET) having a first current electrode coupled to a corresponding bit line of said plurality of bit line pairs, a control electrode coupled to an output of said built-in self test controller for receiving a control signal, and a second current electrode; and
   a capacitor having a first terminal coupled to said second current electrode of said MOSFET, and a second terminal coupled to a power supply terminal.

4. The circuit of claim 2 wherein said degraded memory cell has a read current of greater than 5.5 sigma (5.5 σ) below an average read current of a distribution of read currents in said memory array.

5. The circuit of claim 2 wherein said built-in self test circuit further comprises:
   a word line delay circuit having an enable input, a control input for receiving a delay control signal, and an enable output; and
   a word line decoder having a first input for receiving a row address, a second input coupled to said output of said word line delay circuit, and an output coupled to each of said plurality of word lines of said replica array,
   wherein said built-in self test controller further has a first output coupled to said enable input of said word line delay circuit, a second output for providing said delay control signal, and a third output coupled to said bit lines, wherein said built-in self test controller senses a write time of said memory cells, and provides said headroom signal in response to both said read time and said write time.

6. The circuit of claim 5 wherein said built-in self test controller sets a delay of said word line delay circuit such that a write speed with said delay is equal to a write speed of a second outlier memory cell in said memory array.

7. The circuit of claim 6 wherein said degraded memory cell has a write time of greater than 5.5 sigma (5.5 σ) above an average write time of a distribution of write times in said memory array.

8. The circuit of claim 1 wherein said memory cells of said replica array develop a differential voltage on each of said plurality of bit line pairs during said read time, and said built-in self test circuit senses said read time in response to said differential voltage.

9. The circuit of claim 1 wherein said built-in self test circuit adds said capacitance to each of said bit lines of said plurality of bit line pairs based on a nominal capacitance value of each of said bit lines and a ratio of a read current of a degraded memory cell in said memory array to a nominal read current of said memory cells in said memory array.

10. The circuit of claim 9 wherein said nominal read current is a constant current.

11. A data processor with advanced voltage and frequency scaling (AVFS) comprising:
   a processor core;
   a cache coupled to said processor core comprising a canary circuit,
   said canary circuit for simulating a degraded memory cell in said cache by adding capacitance to a bit line in a replica array and sensing a read speed; and
   a system management unit coupled to said canary circuit and having an output coupled to said processor core for adjusting a processor frequency in response to said read speed.

12. The data processor of claim 11, wherein:
   said replica array having a plurality of word lines and a plurality of bit line pairs with memory cells located at intersections of said plurality of word lines and said plurality of bit line pairs, said memory cells of a same type as memory cells in said cache; and
   said canary circuit further comprises a built-in self test circuit coupled to said replica array for adding said capacitance to each bit line of said plurality of bit line pairs, for sensing a read time of memory cells with said capacitance, and for providing a headroom signal in response to said read time.

13. The data processor of claim 12 wherein said built-in self test circuit comprises:
   a capacitor array having a plurality of switched capacitors coupled to each bit line of said plurality of bit line pairs; and
   a built-in self test controller coupled to said capacitor array, for setting capacitances of said switched capacitors such that a read speed with said capacitances is equal to a read speed of an outlier memory cell in said cache.

14. The data processor of claim 11, wherein said data processor comprises a second processor core coupled to said cache and combined with said processor core into a processor core module.

15. The data processor of claim 11, wherein said data processor comprises at least one graphics processing unit (GPU) core.

16. The data processor of claim 11, wherein said canary circuit further determines a margin in said cache based on simulating said degraded memory cell.

17. A method comprising:
   adding a capacitance to bit lines of a replica array, the replica array having a plurality of word lines and a plurality of bit line pairs with memory cells located at intersections of said plurality of word lines and said plurality of bit line pairs, said memory cells in said replica array of a same type as memory cells in a memory array;
   reading memory cells in said replica array, said memory cells coupled to said plurality of bit lines;
   measuring a read time in response to said reading; and
   providing a headroom signal that indicates said read time in response to said read time, wherein said headroom signal indicates an operating frequency limit, and headroom is a difference between said operating frequency limit and a current operating frequency.

18. The method of claim 17, wherein said adding said capacitance further comprises adding a capacitance such that a read speed with said capacitance added is equal to a read speed of a degraded memory cell in said memory array.

19. The method of claim 17, wherein said providing said headroom signal further comprises:

delaying an activation of a word line;
sensing an access time of a plurality of memory cells coupled to said word line; and
providing said headroom signal further in response to said access time.

* * * * *